United States Patent
Le et al.

(10) Patent No.: US 12,174,257 B2
(45) Date of Patent: Dec. 24, 2024

(54) DEVICE FOR MEASURING RESISTANCE AND INTERNAL RESISTANCE USING RESONANT OSCILLATION

(71) Applicants: Quoc Bao Le, Ho Chi Minh (VN); Tai Gia Hua, Khanh Hoa (VN)

(72) Inventors: Quoc Bao Le, Ho Chi Minh (VN); Tai Gia Hua, Khanh Hoa (VN)

(73) Assignee: WELGUN TECHNOLOGY CORPORATION, Ho Chi Minh City (VN)

( * ) Notice: Subject to any disclaimer, the term of this patent is extended or adjusted under 35 U.S.C. 154(b) by 177 days.

(21) Appl. No.: 18/098,149

(22) Filed: Jan. 18, 2023

(65) Prior Publication Data

US 2023/0280400 A1    Sep. 7, 2023

(51) Int. Cl.
  *G01R 31/36*    (2020.01)
  *G01R 31/389*   (2019.01)

(52) U.S. Cl.
  CPC ....... *G01R 31/3644* (2013.01); *G01R 31/389* (2019.01)

(58) Field of Classification Search
  CPC .................................................. G01R 31/389
  See application file for complete search history.

(56) References Cited

U.S. PATENT DOCUMENTS

| | | | |
|---|---|---|---|
| 2011/0101986 A1* | 5/2011 | Shen ..................... | G01R 31/389 324/430 |
| 2024/0230780 A1* | 7/2024 | Hotta ..................... | G01R 27/02 |

* cited by examiner

*Primary Examiner* — Noam Reisner

(57) ABSTRACT

The present invention relates to a device for measuring resistance and internal resistance using resonant oscillation comprising: an output resonant oscillating unit having an output connectors connected to a target object to be measured resistance or internal resistance to form a closed circuit and causing the resonant oscillation in the closed circuit; an inductive pulse generating unit for generating inductive pulses according to a pulse frequency, so that generating an output induced current in the closed circuit; and a measurement unit. While there is an output induced current appeared in the output resonant oscillating unit will generate a measurement inductive current in the measurement unit and measured and calculated to determine the resistance value of the target object to be measured resistance or internal resistance. The output resonant oscillating unit including an output inductive copper bar and a measurement inductive copper bar, both play a role for generating the inductance in the closed circuit which is composed by the output resonant oscillating unit and the target object to be measured resistance or internal resistance for coupling with the resonant capacitor assembly generating resonance oscillations while there is a suitable pulse frequency; play a role for generating the electromagnetic induction with the output resonant oscillating unit and the measurement unit; and play a role for generating at least a part of load bearing structure of the mounting structure. In addition, the present invention may be capable to determine the natural oscillation frequency of the closed circuit which is composed by the output resonant oscillating unit and the target object to be measured resistance or internal resistance.

10 Claims, 5 Drawing Sheets

DEVICE FOR MEASURING RESISTANCE AND INTERNAL RESISTANCE USING RESONANT OSCILLATION

TECHNICAL FIELD

The present invention relates to a device for measuring resistance and internal resistance using resonant oscillation, in particularly, to a device for measuring resistance and internal resistance using resonant oscillation including an output resonant oscillating unit having output connectors connected to a target object to be measured resistance or internal resistance to form a closed circuit and causing the resonant oscillation in the closed circuit to eliminate inductive and capacitive components of the target object to be measured resistance or internal resistance. The output resonant oscillating unit is substantially composed from copper bars with a relatively small resistance and with inductive and capacitive components are negligible, thus it is capable to measure the target object to be measured resistance or internal resistance with a relatively small resistance, for example at about $\mu\Omega$ range, with an enhanced accuracy.

BACKGROUND

Currently on the market exists two resistance measurement methods for measuring the resistance of a target object to be measured resistance or internal resistance which having a relatively small resistance value, such as the internal resistance of batteries, the resistance of conductive wires, or similar target object to be measured resistance or internal resistance. These are the four-pole measurement method (wire) using DC power source, and the four-pole measurement method (wire) using AC power source.

As for the four-pole measurement method using DC power source, the general principle is that using a measurement device to inject a DC current with high intensity to the target object to be measured resistance or internal resistance. For example, as for the measurement of the internal resistance of the battery, for example, the measurement device will inject a DC current with high intensity to the battery, and then carry out to measure the voltage drop on the two terminal of the battery, the internal resistance of the battery is calculated based on the Ohm law: R=V/I. Although the method is relatively simple, however there is a disadvantage which is not capable to measure an active/operating battery. In addition, to generate a DC current with high intensity to inject to the battery may be not easy, this requires the measurement device equipped with high power elements, high power consumption, manufacturing, repairing, and replacement costs are high.

As for the four-pole measurement method using AC power source, the general principle is that using an AC current to determine the voltage drop on the battery and derive the internal resistance of the battery to be measured. This method is capable to measure the internal resistance of the battery which changing in the range from a few m$\Omega$ to hundreds m$\Omega$ based on the type of the battery and the capacity of the battery. According to the method, the purpose of using the AC current is to lose the affection to the power source of the battery. The AC current, for example $I_s$ provided to measure the internal resistance, the voltage dropped on the battery, for example $V_s$. Since $I_s$ determined and the measured internal resistance is not depended on the contact resistance and the wiring resistance. The resistance of the voltmeter is very high, therefore there is no current pass through the voltmeter, as the result the measured voltage is only drop on the internal resistance of the battery. Although it may be provided without high power elements, the method also has a disadvantage, by using the AC current for measuring the voltage drop on the two terminal of the battery will not detect the value of the internal capacitive and inductive components of the battery, this leads to the value of the measured internal resistance may be incorrect. In addition, while applying the method to measure the battery with a very small internal resistance at about micro ohms, the voltage drop on the two terminals of the battery is very small, so there is needed dedicated measurement elements, difficult to prepare, manufacture, and with high cost.

Another disadvantage of the four-pole measurement method using AC power source is that the measurement device itself according to the method may exist inductive and capacitive components, therefore it is difficult to correctly measure the internal resistance of the battery having a small value.

To eliminate inductive and capacitive components on the measurement device, some approaches have proposed a measurement method using resonant oscillation, based on a principal while there is a resonant oscillation appeared, the inductive and capacitive components in the circuit are eliminated, only remaining the resistance component.

An example for the measurement method using resonant oscillation have disclosed in the Chinese utility model publication number CN204514975U. The document provides a battery internal resistance inspecting and measuring device using an AC power source to generate the resonance oscillation. Accordingly, the frequency of the AC power source needed to be predetermined such that substantially causes an oscillation with the oscillation frequency capable to generate the oscillation with the predetermined oscillation frequency, to eliminate the inductive, capacitive components, for example on the device for inspecting and measuring the internal resistance of the battery and/or predetermined type of battery, the purpose is to precisely determine the value of the internal resistance of the battery. However, while applying for the target objects to be measured resistance or internal resistance, the batteries, this method not yet consider the present of the internal inductive and capacitive components of the various target objects to be measured resistance or internal resistance, may be different to each other, resulting the measured internal resistance will be not precisely due to the affection of the internal inductive and capacitive components.

Furthermore, the measurement method using resonant oscillation in the document CN204514975U using inductor coil and capacitor are the inductive and capacitive components which are components generate the resonant oscillation in the circuit. However, the inductor coil itself having inductive resistance, resulting the measured resistance value may include both the resistance of the target object to be measured resistance or internal resistance, and of the inductor coil, therefore is difficult to precisely measure the internal resistance of the battery having a very small value, for example about a few $\mu\Omega$.

Hence, there is a need for a resistance measurement method using resonant oscillation, capable to measure the internal resistance of the battery having a small value with an enhanced accuracy.

SUMMARY

An object of the present invention is to provide a device for measuring resistance and internal resistance using resonant oscillation, may overcome one or more of the above-mentioned problems.

Another object of the present invention is to provide a device for measuring resistance and internal resistance using resonant oscillation, capable to measure the internal resistance of the batteries having a small value with an enhanced accuracy even when the batteries are working.

Yet another object of the present invention is to provide a device for measuring resistance and internal resistance using resonant oscillation having a simplified structure and optimized durability.

Various objects to be achieved by the present invention are not limited to the aforementioned objects, and those skilled in the art to which the disclosure pertains may clearly understand other objects from the following descriptions.

To achieve one or more above objects, the present invention provides a device for measuring resistance and internal resistance using resonant oscillation comprising:

an output resonant oscillating unit having output connectors connected to target object to be measured resistance or internal resistance to form a closed circuit and causing the resonant oscillation in the closed circuit;

an inductive pulse generating unit for generating inductive pulses according to a pulse frequency, wherein the inductive pulse generating unit is arranged to generate the electromagnetic induction between the inductive pulse generating unit and the output resonant oscillating unit, thereby generating an output induced current while there are pulses appeared in the inductive pulse generating unit;

a measurement unit including a measurement inductive portion and a measurement portion, wherein the measurement inductive portion is arranged to generate the electromagnetic induction between the measurement inductive portion and the output resonant oscillating unit, thereby generating a measurement inductive current while there is an output induced current appeared in output resonant oscillating unit, measurement portion for measuring the value of the current, the value of the voltage of the measurement inductive current;

a control and processing unit for calculating the value of the resistance or the internal resistance of target object to be measured resistance or internal resistance based on the value of the current, the value of the voltage of the measurement inductive current;

a mounting structure for mounting at least the output resonant oscillating unit, the inductive pulse generating unit, and the measurement unit;

wherein:

the output resonant oscillating unit including an output inductive copper bar, measurement inductive copper bar, and a resonant capacitor assembly, the inductive pulse generating unit including a pulse generating inductor, the pulse generating inductor is provided so that its inductive wire loops surrounding a part of the output inductive copper bar, to generate the electromagnetic induction between the inductive pulse generating unit and the output resonant oscillating unit, the measurement inductive portion of the measurement unit including a measurement inductor, the measurement inductor is provided so that its inductive wire loops surrounding a part of measurement inductive copper bar, to generate the electromagnetic induction between the measurement inductive portion and the output resonant oscillating unit, the output connectors including a first output connector is electrically connected to the output inductive copper bar, and the second output connector is electrically connected to the measurement inductive copper bar, wherein the output inductive copper bar and the measurement inductive copper bar both play a role for generating the inductance in the closed circuit which is composed of the output resonant oscillating unit and the target object to be measured resistance or internal resistance for coupling with the resonant capacitor assembly generating a resonance oscillation while there is a suitable pulse frequency, and play a role for generating at least a part of the load bearing structure of the mounting structure.

According to an embodiment, the first output connector including a first copper pillar and a first output copper bar, second output connector including a second copper pillar and a second output copper bar, wherein the first copper pillar is electrically connected between the output inductive copper bar and the first output copper bar, the second copper pillar is electrically connected between the measurement inductive copper bar and the second output copper bar, and each of the first output copper bar and the second output copper bar having at least one output coupling hole for coupling the first or second output copper bar with a battery terminal post or a similar element.

According to another embodiment, the first output connector including a first electrode copper bar, the first copper pillar, and the first output copper bar, the second output connector including a second electrode copper bar, the second copper pillar, and the second output copper bar, wherein the first copper pillar is coupled to the first electrode copper bar to form an assembly which is electrically connected between the output inductive copper bar and the first output copper bar, the second copper pillar is coupled to the second electrode copper bar to form an assembly which is electrically connected between the measurement inductive copper bar and the second output copper bar, and each of the first output copper bar and the second output copper bar having at least one output coupling hole for coupling the output copper bar with a battery terminal post or a similar element.

Preferably, the first output copper bar is rotatably mounted with the first copper pillar and the second output copper bar is rotatably mounted with second copper pillar, thus when rotating the first output copper bar and/or the second output copper bar to the first copper pillar and/or the second copper pillar will change the distance between the output coupling holes so that the first output copper bar and the second output copper bar are coupleable with pairs of positive and negative battery terminal posts having various different distances.

According to another further embodiment, the first output connector and the second output connector are the first output copper bar and the second output copper bar, respectively.

Preferably, each of the first output copper bar and the second output copper bar having at least one output coupling hole for coupling the output copper bar with a battery terminal post or a similar element.

Preferably, the output coupling hole having an oval shape, so that the first output copper bar and the second output copper bar are coupleable with pairs of positive and negative battery terminal posts having various different distances.

According to another embodiment, the first output connector and the second output connector are measuring rods.

According to an embodiment, the control and processing unit is further configured to:
controlling the inductive pulse generating unit to generating the inductive pulses according to the pulse frequency with its value gradually varies from low to high being in a range from a lower threshold pulse frequency to an upper threshold pulse frequency,
sampling continuously the signal of the measurement inductive current to determine the value of the current and the signal form of the measurement inductive current,
determining, based on the value of the current and the signal form of the measurement inductive current, the natural oscillation frequency of the closed circuit which is composed by the output resonant oscillating unit and the target object to be measured resistance or internal resistance,
wherein the natural oscillation frequency is determined corresponding to the pulse frequency which generates the value of the current of the measurement inductive current having a maximum value and/or the signal form of the measurement inductive current having a substantially sinusoidal signal.

Preferably, the device further comprising a device housing exposing at least a part of the first output connector and the second output connector.

DESCRIPTION OF EMBODIMENTS

Figure 1:
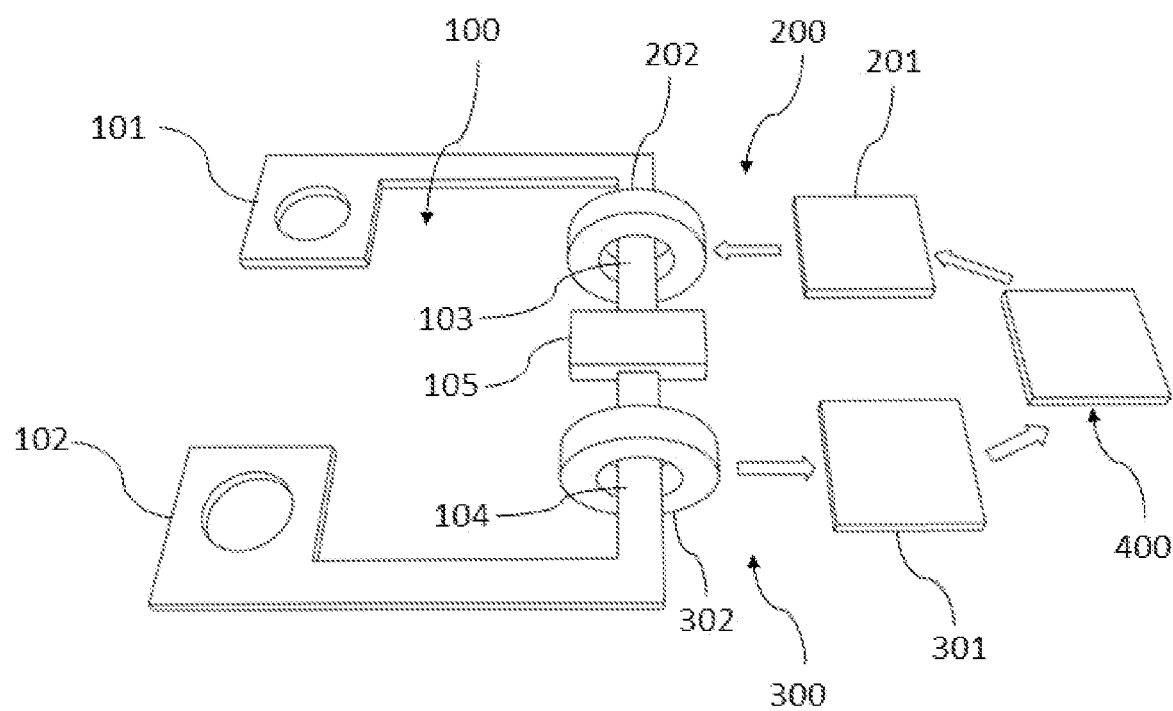
FIG. 1 is a schematic diagram view illustrating main components and basic principal of the device for measuring resistance and internal resistance using resonant oscillation according to the present invention.

Hereinafter, advantages, efficiencies, and inventive concepts of the present invention shall be understood more clearly through the detailed description of the preferred embodiments with reference to the accompanying drawings. In the drawings, same reference numbers are intended to indicate same or equivalent components or elements and commonly used in the whole description, therefore in several drawings or several parts of a drawings may not show one or more reference numbers for a purpose that makes the drawings becoming simplified and facilitating for showing composed components or different inventive concepts of the present invention, in this scenario, relationships between certain components or elements with corresponding reference numbers may be clearly illustrated when referring to other drawings or other components on the drawing. In addition, the components and elements illustrated in the drawings is not complied actual sizes and shapes, several components or elements shall be exaggerated and may be presented by simplified blocks for illustrated purposes and facilitating for descriptive purpose. Therefore, it should be understood that embodiments described herein is only exemplary for fully understanding of the inventive steps and advantages of the present invention, without any limitation of the present invention to the embodiments.

The spatial relatively terms, such as "front", "rear" "length", "width", "height", "above", "on", or the same, may be used herein for descriptive purpose, and, therefore, to describe relationship of a component with other component(s) as illustrated in the drawings. It is obviously that, those terms may be interchangeable by the position or the role for the illustration of actual subject matter according to the present invention, for example, if the illustrated object in the drawings is rotated about 180 degrees for example, components which are described as "front" or "rear" will interchange to each other. Therefore, the spatial relatively terms are used as exemplary for descriptive purpose may be included other meanings indicated for other spatial relationships due to the orientation of the illustrated object, such as the term "front" may encompass "rear", for example.

The terms of order, for example "first", "second", "third", or the same, may be used herein for descriptive purposes while distinguish among elements or components having similar or equivalent functions or characteristics, and it is not understood as defining any constrained order or the number of those elements or components, for example in a certain embodiment may describe that only comprising a second component, and therefore the embodiment no needs the presence of a first component.

Firstly, the main components and basic operating principles of the device for measuring resistance and internal resistance using resonant oscillation according to the present invention will be described in detail with a reference to FIG. 1.

As shown in FIG. 1, the device for measuring resistance and internal resistance using resonant oscillation according to the present invention including main components which are an output resonant oscillating unit 100, an inductive pulse generating unit 200, a measurement unit 300, and a control and processing unit 400.

The output resonant oscillating unit 100 having output connectors connected to a target object to be measured resistance or internal resistance to form a closed circuit and causing the resonant oscillation in the closed circuit. The output connectors including a first output connector 101 and a second output connector 102.

The inductive pulse generating unit 200 for generating inductive pulses according to a pulse frequency, wherein the inductive pulse generating unit 200 is arranged to generate the electromagnetic induction between the inductive pulse generating unit 200 and the output resonant oscillating unit 100, thereby generating an output induced current while there are pulses appeared in the inductive pulse generating unit 200. The output induced current is a current flowing in the closed circuit which is composed by the output resonant oscillating unit and the target object to be measured resistance or internal resistance, the output induced current will have a frequency depending on the said pulse frequency. So as, when changing the pulse frequency, it can change the frequency of the output induced current, in the case that the frequency of the output induced current is substantially equal to the natural oscillation frequency of the closed circuit, it will cause the resonant oscillation in the closed circuit.

The measurement unit 300 including a measurement inductive portion 302 and a measurement portion 301, wherein the measurement inductive portion 302 is arranged to generate the electromagnetic induction between the measurement inductive portion 302 and the output resonant oscillating unit 100, thereby generating a measurement inductive current while there is an output induced current appeared in the output resonant oscillating unit 100. The measurement inductive current is a current flowing in the measurement inductive portion 302, while there is a resonant oscillation appeared, the output induced current will substantially reach to a fixed average value, as the results, the measurement inductive current will also have a fixed average value and it is capable to be measured.

The measurement portion 301 for measuring the value of the current, the value of the voltage of the measurement inductive current.

The control and processing unit 400 for calculating the value of the resistance or the internal resistance of the target object to be measured resistance or internal resistance based on the value of the current, the value of the voltage of the measurement inductive current.

Herein, the target object to be measured resistance or internal resistance may be a battery (the object to be measured internal resistance) or a conductive wire (the object to be measured resistance), or any similar object. For the convenience of description, hereinafter may only use the term "resistance" but it may be understood that, in several cases, it may cover all of "internal resistance", "resistance or internal resistance", or "resistance and internal resistance".

As also shown in the drawing, the inductive pulse generating unit 200 including a pulse generating inductor 202 and a resonant pulse generating power unit 201, the measurement inductive portion 302 may include a measurement inductor, and the measurement portion 301 may include a rectifying and measurement signal modulating unit. It is supposed that when the inductive pulse generating unit 200 is to generate the inductive pulses according to the pulse frequency substantially being equal to the natural oscillation frequency of the closed circuit which is composed by the output resonant oscillating unit and the target object to be measured resistance or internal resistance, the average current in the inductive pulse generating unit 200 is a constant, the induced electromotive force in the closed circuit is also a constant, and while there is a resonance occurred, inductive and capacitive components are substantially eliminated, there is only the resistance component of the target object to be measured resistance or internal resistance, and the resistance of the output resonant oscillating unit 100. In the case that the output resonant oscillating unit 100 is provided with the resistance is negligible or approximately zero, then the calculated resistance value is substantially the resistance target object to be measured resistance or internal resistance. The induced electromotive force in the closed circuit is represented by the measurement inductive current which is sampled and measured the signal amplitude value by the measurement portion 301 and transmitted to the control and processing unit 400 for calculating and providing the resistance value of the target object to be measured resistance or internal resistance. As the results, it is capable to measure precisely the resistance of the target object to be measured resistance or internal resistance.

According to a preferred embodiment, the output resonant oscillating unit 100 including an output inductive copper bar 103, a measurement inductive copper bar 104, and a resonant capacitor assembly 105.

Herein, the copper bar is defined as a bar with any shape (may be straight, curved, or being bent to various different shapes), is made from bronze/copper-based material, or copper alloys. The purpose of using the copper bar(s) according to the present invention is to both generate inductive/electromagnetic induction function, and generate the resistance which is negligible or approximately zero. Thus, the present invention may also apply materials with corresponding properties to replace for copper or copper-based material, as for this aspect, the copper bar may also be defined as an extended meaning as a bar which is made from material with similar properties that is replaceable for copper or copper-based material as long as it can achieve the corresponding technical purpose of the present invention.

The inductive pulse generating unit 200 including a pulse generating inductor 202, the pulse generating inductor 202 is provided so that its inductive wire loops surrounding a part of the output inductive copper bar 103, for generating the electromagnetic induction between the inductive pulse generating unit 200 and the output resonant oscillating unit 100.

The measurement inductive portion 302 of the measurement unit 300 including a measurement inductor, the measurement inductor is provided so that its inductive wire loops surrounding a part of the measurement inductive copper bar 104, for generating the electromagnetic induction between the measurement inductive portion 302 and the output resonant oscillating unit 100.

The output connectors including a first output connector 101 electrically connected to the output inductive copper bar 103, and a second output connector 102 electrically connected to the measurement inductive copper bar 104.

Obviously, with these main components and basic operating principles as described above, the device for measuring resistance and internal resistance using resonant oscillation according to the present invention may be provided as various different shapes and structures. According to a particular example, the device for measuring resistance and internal resistance using resonant oscillation may use a mounting structure for mounting at least the output resonant oscillating unit 100, the inductive pulse generating unit 200, and the measurement unit 300.

The mounting structure may be as simple as a circuit board or the same.

Preferably, the output inductive copper bar 103 and the measurement inductive copper bar 104 both play a role for generating the inductance in the closed circuit which is composed by the output resonant oscillating unit 100 and the target object to be measured resistance or internal resistance for coupling with the resonant capacitor assembly 105 generating resonance oscillations while there is a suitable pulse frequency, and play a role for generating at least a part of the load bearing structure of the mounting structure.

Figure 2:
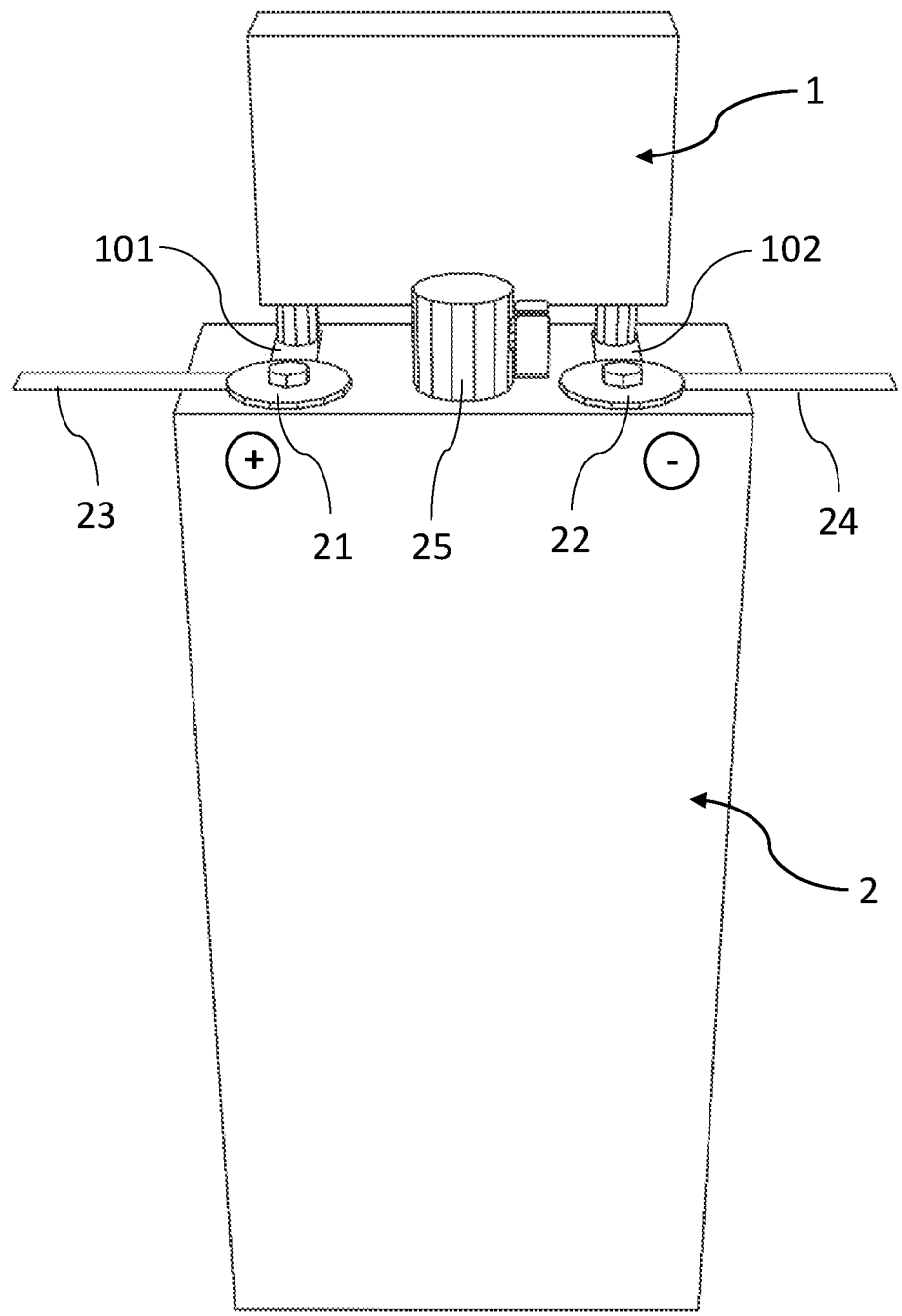
FIG. 2 is a perspective view illustrating the device for measuring resistance and internal resistance using resonant oscillation being used to measure the internal resistance of the battery according to an embodiment of the present invention.

FIG. 2 shows the device for measuring resistance and internal resistance using resonant oscillation according to an embodiment of the present invention, applied to measure the internal resistance of batteries.

As shown in the drawing, the device for measuring resistance and internal resistance using resonant oscillation 1 according to this embodiment having a first output connector 101 and a second output connector 102 are connected to the positive electrode post 21 and the negative electrode post 22 of the battery 2, respectively. The battery 2 may be active/in operation (online) having the positive electrode post 21 and the negative electrode post 22 connected to corresponding power source wires 23, 24. Most of the main components of the device for measuring resistance and internal resistance using resonant oscillation 1 according to the embodiment are arranged and contained inside a device housing (will be described hereafter), except a part of the first output connector 101 and a part of the second output connector 102 which are exposed to outside. The exposed parts of the first output connector 101 and the second output connector 102 are arranged such a manner that the device for measuring resistance and internal resistance using resonant oscillation 1 is coupled to the battery 2 avoiding to be entangled by the filler cap 25 of the battery 2.

Figure 3:
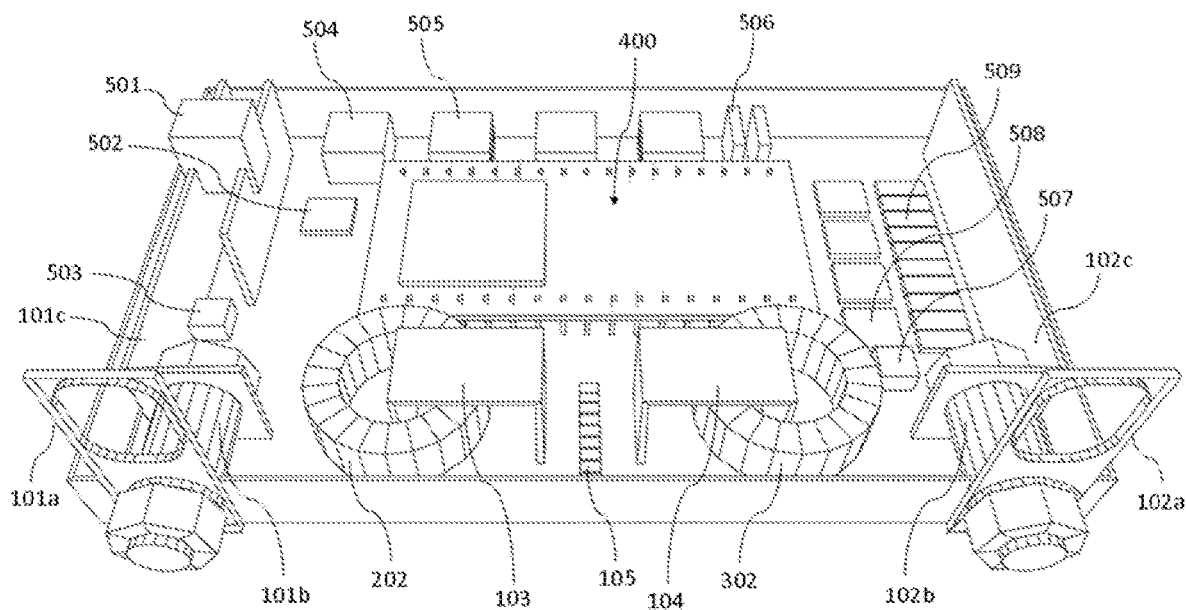
FIG. 3 is a perspective view with the device housing partially omitted illustrating more clearly the inside components of the device for measuring resistance and internal resistance using resonant oscillation according to an embodiment of the present invention.

FIG. 3 is a perspective view with the device housing partially omitted illustrating the inside components of the device for measuring resistance and internal resistance using resonant oscillation according to an embodiment of the present invention.

As shown in the drawing, the device for measuring resistance and internal resistance using resonant oscillation according to this embodiment substantially having same main components as described above, including an output resonant oscillating unit 100, an inductive pulse generating unit 200, and a measurement unit 300 are mounted on the mounting structure which is a printed circuit board with a rectangular shape.

According to the embodiment, the first output connector 101 including a first electrode copper bar 101c, a first copper pillar 101b, and a first output copper bar 101a, the second output connector 102 including a second electrode copper bar 102c, a second copper pillar 102b, and a second output copper bar 102a. The first copper pillar 101b is coupled to the first electrode copper bar 101c to form an assembly which is electrically connected between the output inductive copper bar 103 and the first output copper bar 101a, the second copper pillar 102b is coupled to the second electrode copper bar 102c to form an assembly which is electrically connected between the measurement inductive copper bar 104 and the second output copper bar 102a.

Preferably, each of the first output copper bar 101a and the second output copper bar 102a having at least one output coupling hole for coupling the first and second output copper bars 101a, 102a with battery electrode posts or the same.

In general, the first electrode copper bar 101c and the output inductive copper bar 103, the second electrode copper bar 102c and the measurement inductive copper bar 104 may be electrically connected to each other via lines on the printed circuit board. However, the present invention is not limited thereto, the electric connection may use any conductive material, or the first electrode copper bar 101c and the output inductive copper bar 103 may be provided integral, the second electrode copper bar 102c and the measurement inductive copper bar 104 may be provided integral.

Figure 4:
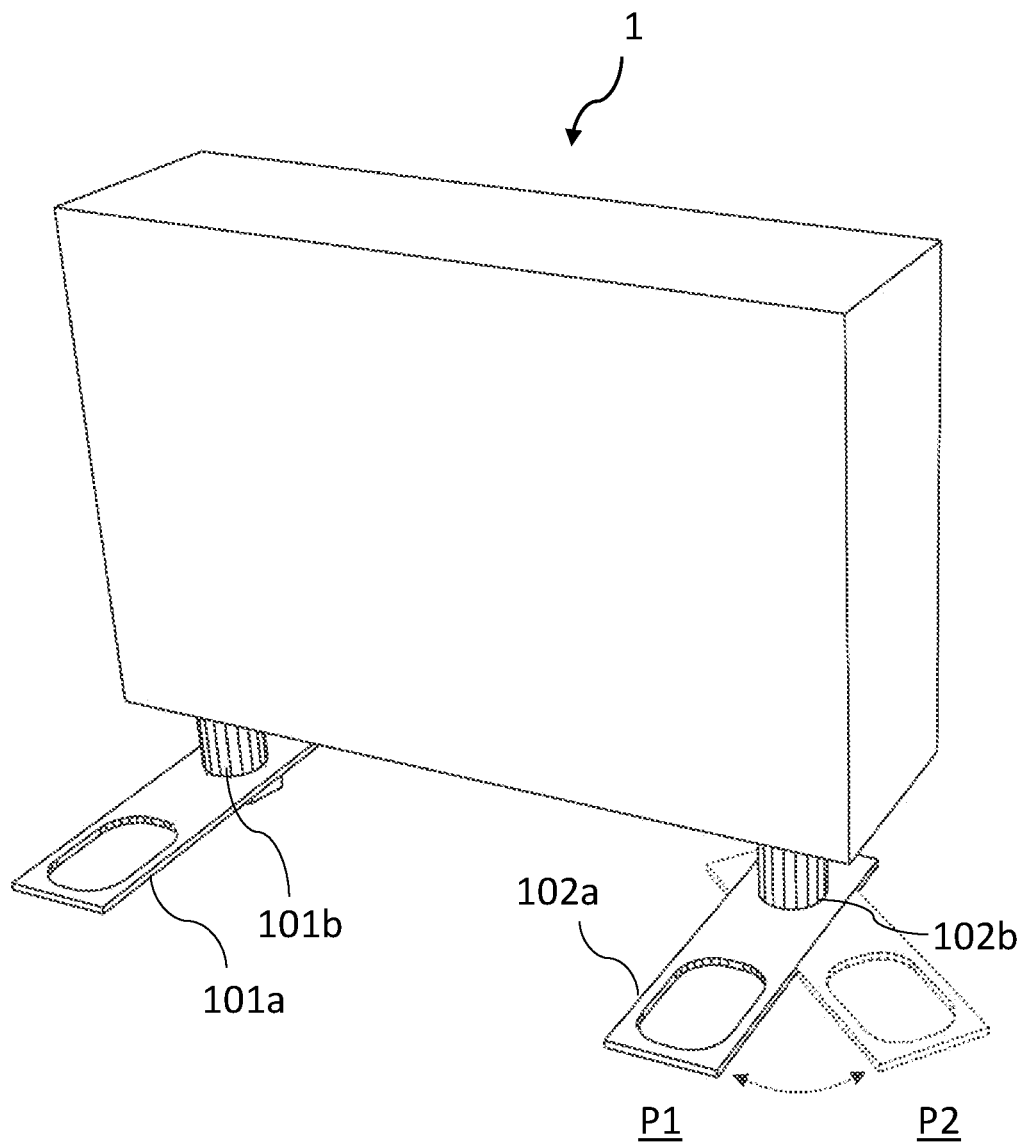
FIG. 4 is a perspective view illustrating the device for measuring resistance and internal resistance using resonant oscillation according to an embodiment of the present invention.

It is obviously that, with the structure of the first output connector 101 and the second output connector 102 as shown in FIG. 4, these components which are the first output connector 101, the second output connector 102, the output inductive copper bar 103, and the measurement inductive copper bar 104, not only play a role generating inductance components, but also play a role providing a partial load bearing structure for the mounting structure and the device for measuring resistance and internal resistance using resonant oscillation according to the present invention as well. Moreover, the resistance value of these components, in the form of copper bar, are substantially negligible and may be considered to approximately zero.

According to an alternative embodiment, the first output connector 101 may not use the first electrode copper bar 101c, and the second output connector 102 may not use the second electrode copper bar 102c. Accordingly, the first copper pillar 101b may be electrically connected to the output inductive copper bar 103, and the second copper pillar 102b may be electrically connected to the measurement inductive copper bar 104. The electric connection herein may be implemented via lines on the printed circuit board, any conductive material, or provided as an integral unitary.

According to another alternative embodiment, the first output connector 101 may not use the first electrode copper bar 101c, the first copper pillar 101b, and the second output connector 102 may not use the second electrode copper bar 102c, the second copper pillar 102b. Accordingly, the first output copper bar 101a may be electrically connected to the output inductive copper bar 103, and the second output copper bar 102a may be electrically connected to the measurement inductive copper bar 104. The electric connection herein may be implemented via lines on the printed circuit board, any conductive material, or provided as an integral unitary.

According to an embodiment, the first output copper bar 101a is rotatably mounted with the first copper pillar 101b and the second output copper bar 102a is rotatably mounted with the second copper pillar 102b, so that when rotating the first output copper bar 101a and/or the second output copper bar 102a to the first copper pillar 101b and/or the second copper pillar 102b will change the distance between the output coupling holes so that the first output copper bar and the second output copper bar are coupleable with pairs of positive and negative battery terminal posts having various different distances.

FIG. 4 shows more clearly the property that the first output copper bar 101a is rotatably mounted with the first copper pillar 101b and the second output copper bar 102a is rotatably mounted with the second copper pillar 102b. As shown in the drawing, the second output copper bar 102a is illustrated as it rotates from the position P1 to the position P2 around the second copper pillar 102b. Although it is not clearly illustrated in the drawing, however it should be understood that the first output copper bar 101a may be rotatable with the first copper pillar 101b in the similar way.

According to an alternative embodiment, each of the first output copper bar 101a and the second output copper bar 102a having at least one output coupling hole for coupling the output copper bar with a battery terminal post or a similar element, and the output coupling hole may have an oval shape, so that the first output copper bar 101a and the second output copper bar 102a are coupleable with pairs of positive and negative battery terminal posts having various different distances.

Optionally, each of the first output copper bar and the second output copper bar may also have more than one coupling hole.

It is obviously that, the first output copper bar 101a and the second output copper bar 102a may also have any structure to suitable for measuring the different target object to be measured resistance or internal resistance other than a battery.

Reference back to FIG. 3, the pulse generating inductor 202 and the measurement inductor of the measurement inductive portion 302 having a hollow cylindrical shape is placed above the mounting structure which is in form of a printed circuit board, the output inductive copper bar 103 is bent to pass through the hollow core of the pulse generating inductor 202, and the measurement inductive copper bar 104 is bent to pass through the hollow core of the measurement inductor of the measurement inductive portion 302, for generating an expected electromagnetic induction. The resonant capacitor assembly 105 is arranged between the output inductive copper bar 103 and the measurement inductive copper bar 104. It is conspicuous that the above mentioned structure aims to a robust and simplification.

According to an embodiment as shown in FIG. 3, the device for measuring resistance and internal resistance using resonant oscillation according to the present invention may be equipped with a main fuse 501, an inductive pulse hash unit 502, a battery temperature sensor 503, a hard reset unit 504, a booster power unit 505, a input signal adjusting rheostat 506, a main board temperature sensor 507, a battery voltage protecting and balancing unit 508, and a balanced power resistors unit 509. In general, one or several of these components may be used to contribute to perform the resistance measurement function (for example the inductive pulse hash unit 502), or may also provide additional functions other than the resistance measurement function (for example the battery temperature sensor 503), or may also provide safety functions for the device. These components may be provided in any method which not affects basic operating principles of the present invention, therefore, the above descriptions of them are intended to omit to focus more on the other important contents of the present invention.

Figure 5:
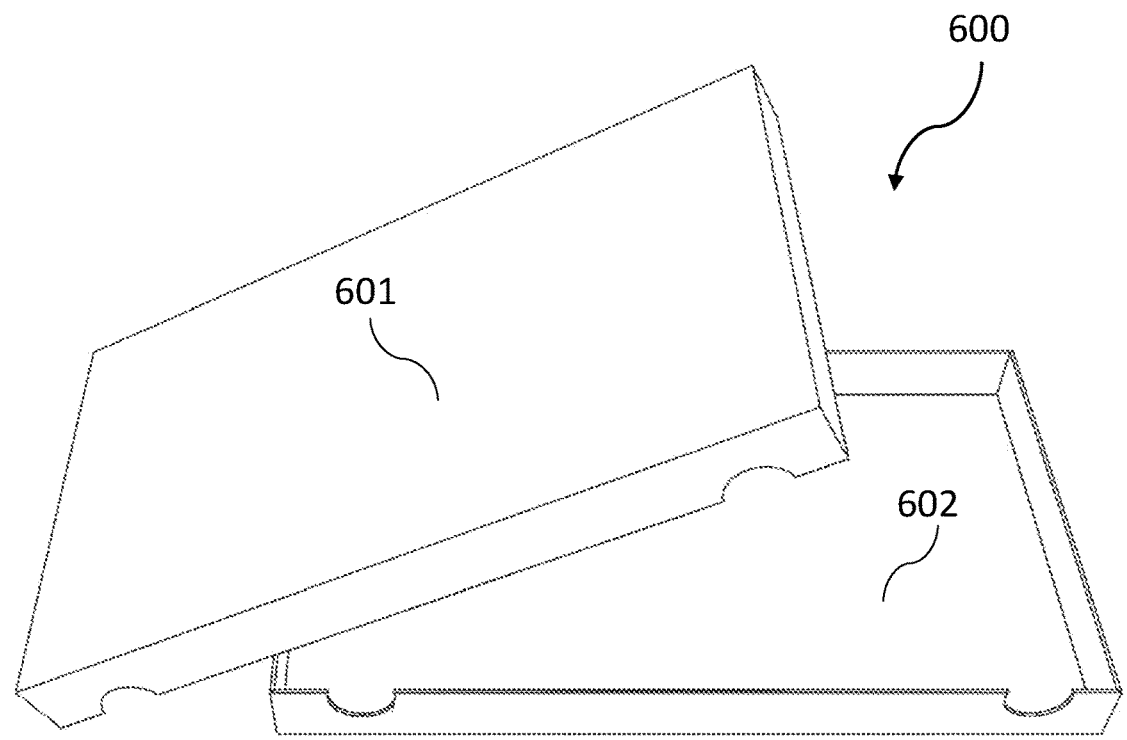
FIG. 5 is a perspective view illustrating the device housing of the device for measuring resistance and internal resistance using resonant oscillation according to an embodiment of the present invention.

As also illustrated by the embodiment, most of the main components of the device for measuring resistance and internal resistance using resonant oscillation according to the present invention arranged and contained inside the device housing 600 (see FIG. 5). The device housing 600 with the most simplification may include a first housing part 601 and a second housing part 602 are coupled to each other, having holes to couple the first and second copper pillar 101b, 102b pass there through. However, the present invention is not limited thereto.

Although, as described and shown in the drawings, the target object to be measured resistance or internal resistance is illustrated as a battery and the resistance to be measured is the internal resistance of the battery, however the present invention is not limited thereto, the person skilled in the art could understand that the present invention may be applied to measure resistance of any target object to be measured resistance or internal resistance, for example a conductive wire.

Figure 6:
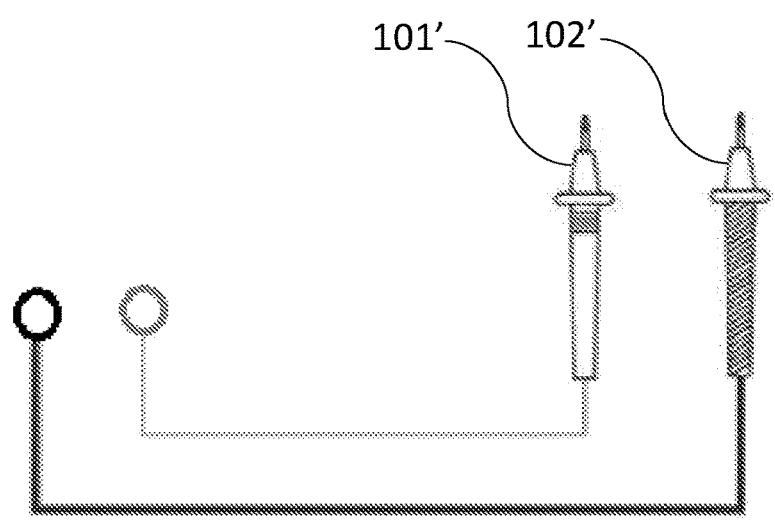
FIG. 6 is a schematic view illustrating the first output connector and the second output connector of the output resonant oscillating unit of the device for measuring resistance and internal resistance using resonant oscillation according to an embodiment of the present invention.

FIG. 6 illustrates the first output connector and the second output connector according to an embodiment of the present invention. According to this embodiment, the first output connector and the second output connector are measuring rods 101', 102'.

According to a preferred embodiment, the device for measuring resistance and internal resistance using resonant oscillation according to the present invention is capable to detect the natural oscillation frequency of the closed circuit which is composed by output resonant oscillating unit and the target object to be measured resistance or internal resistance. To carry out the said function, the control and processing unit is configured to:

controlling the inductive pulse generating unit to generating the inductive pulses according to the pulse frequency with its value gradually varies from low to high being in a range from a lower threshold pulse frequency to an upper threshold pulse frequency, sampling continuously the signal of the measurement inductive current to determine the value of the current and the signal form of the measurement inductive current, determining, based on the value of the current and the signal form of the measurement inductive current, the natural oscillation frequency of the closed circuit which is composed by the output resonant oscillating unit and the target object to be measured resistance or internal resistance, wherein the natural oscillation frequency is determined corresponding to the pulse frequency which generates the value of the current of the measurement inductive current having a maximum value and/or the signal form of the measurement inductive current having a substantially sinusoidal signal.

Particularly, the control and processing unit will control to generate square pulses in the inductive pulse generating unit starting at a lower frequency (f1) and gradually increasing to an upper pulse frequency (f2). The frequency range from f1 to f2 is calculated so that it is in between the whole measuring range of the device, i.e. the natural oscillation frequency (f0) of the closed circuit which is composed by the output resonant oscillating unit and the target object to be measured resistance or internal resistance is always in the frequency range from f1 to f2 (f1<f0<12), substantially. The control and processing unit will sample continuously the signal from the measurement unit to analyze the amplitude and the waveform of the signal. When the pulse frequency is equal to f0 then it occurs a resonant oscillation in the closed circuit. Since the closed circuit includes the resistance (R), inductances (L) and capacitive (C) components, so while there is a resonance occurring the amplitude of the current will reach to the maximum value and having a waveform is substantially a standard sinusoidal signal. At that moment, the signal in the measurement unit will also have a maximum value and varies according to the standard sinusoidal waveform. The control and processing unit may be based on two factors which are the maximum amplitude value and the standard sinusoidal waveform to determine the natural oscillation frequency or the mentioned resonant oscillation frequency f0.

In general, the resonant oscillation frequency f0 determining may be carried out automatically by the control and processing unit in each measurement, as for that, the device for measuring resistance and internal resistance using resonant oscillation will carry out the resistance measurement of the target object to be measured resistance or internal resistance according to two steps including the first step of determining the resonant oscillation frequency f0 by above mentioned method, and the second step of generating inductive pulses with the pulse frequency equal to the resonant oscillation frequency f0 to carry out the measurement and calculating the resistance value of the target object to be measured resistance or internal resistance.

The determining of the resonant oscillation frequency f0 may be carry out prior the usage of the device for several common or typical target objects to be measured resistance or internal resistance, and these values may be stored in the ROM storage of the control and processing unit to use as reference pulse frequencies, when measuring a particular target object to be measured resistance or internal resistance, the reference pulse frequency corresponding to the particular target object to be measured resistance or internal resistance may be used without carrying out the method to detect the resonant oscillation frequency. These reference pulse frequencies may be selected by button pressing, set up, or any manner when it is a need to measure the resistance.

According to a preferred embodiment, the device for measuring resistance and internal resistance using resonant oscillation according to the present invention may be equipped a display for displaying measurement results.

According to another embodiment, the device for measuring resistance and internal resistance using resonant oscillation according to the present invention may be equipped a communication unit (wired or wireless) to send measurement results to a device which is connected via the communication unit. The connected device may be a control panel of a vehicle using batteries, a remote server, a remote electronic device, a computer, computing devices, or any device which is capable to connect to the communication unit need to receive the measurement results for processing, displaying, or forwarding.

According to a particular example, the communication unit may use wireless communication, for example Bluetooth, WiFi, RF, LoRa, Zigbee, or the same.

Although some embodiments have been described herein, and may accompanying with alternative or equivalent embodiments or specific exemplarily embodiment, using suitable descriptive terms and technical terms for person skilled in the art may understand and pertain the present invention. Therefore, the person skilled in the art may obviously implement modifications, equivalent arrangements, or variations based on the described embodiments. Therefore, all these modifications, equivalents, or variations fall within the protection scope of the claims appended, and the scope of the protection of the present invention is obviously not limited to contents and descripted embodiments but is defined in the following claims.

What is claimed is:

1. A device for measuring resistance and internal resistance using resonant oscillation comprising:
    an output resonant oscillating unit having output connectors connected to target object to be measured resistance or internal resistance to form a closed circuit and causing the resonant oscillation in the closed circuit;
    an inductive pulse generating unit for generating inductive pulses according to a pulse frequency, wherein the inductive pulse generating unit is arranged to generate the electromagnetic induction between the inductive pulse generating unit and the output resonant oscillating unit, thereby generating an output induced current while there are pulses appeared in the inductive pulse generating unit;
    a measurement unit including a measurement inductive portion and a measurement portion, wherein the measurement inductive portion is arranged to generate the electromagnetic induction between the measurement inductive portion and the output resonant oscillating unit, thereby generating a measurement inductive current while there is an output induced current appeared in output resonant oscillating unit,
    measurement portion for measuring the value of the current, the value of the voltage of the measurement inductive current;
    a control and processing unit for calculating the value of the resistance or the internal resistance of target object to be measured resistance or internal resistance based on the value of the current, the value of the voltage of the measurement inductive current;
    a mounting structure for mounting at least the output resonant oscillating unit, the inductive pulse generating unit, and the measurement unit;
    wherein:
    the output resonant oscillating unit including an output inductive copper bar, measurement inductive copper bar, and a resonant capacitor assembly,
    the inductive pulse generating unit including a pulse generating inductor, the pulse generating inductor is provided so that its inductive wire loops surrounding a part of the output inductive copper bar, to generate the electromagnetic induction between the inductive pulse generating unit and the output resonant oscillating unit,
    the measurement inductive portion of the measurement unit including a measurement inductor, the measurement inductor is provided so that its inductive wire loops surrounding a part of measurement inductive copper bar, to generate the electromagnetic induction between the measurement inductive portion and the output resonant oscillating unit,
    the output connectors including a first output connector is electrically connected to the output inductive copper bar, and the second output connector is electrically connected to the measurement inductive copper bar,
    wherein the output inductive copper bar and the measurement inductive copper bar both play a role for generating the inductance in the closed circuit which is composed of the output resonant oscillating unit and the target object to be measured resistance or internal resistance for coupling with the resonant capacitor assembly generating a resonance oscillation while there is a suitable pulse frequency, and play a role for generating at least a part of the load bearing structure of the mounting structure.

2. The device according to claim 1, wherein the first output connector including a first copper pillar and a first output copper bar, second output connector including a second copper pillar and a second output copper bar,
    wherein the first copper pillar is electrically connected between the output inductive copper bar and the first output copper bar, the second copper pillar is electrically connected between the measurement inductive copper bar and the second output copper bar, and
    each of the first output copper bar and the second output copper bar having at least one output coupling hole for coupling the first or second output copper bar with a battery terminal post or a similar element.

3. The device according to claim 1, wherein the first output connector including a first electrode copper bar, the first copper pillar, and the first output copper bar, the second output connector including a second electrode copper bar, the second copper pillar, and the second output copper bar,
    wherein the first copper pillar is coupled to the first electrode copper bar to form an assembly which is electrically connected between the output inductive copper bar and the first output copper bar, the second copper pillar is coupled to the second electrode copper bar to form an assembly which is electrically connected between the measurement inductive copper bar and the second output copper bar, and
    each of the first output copper bar and the second output copper bar having at least one output coupling hole for coupling the output copper bar with a battery terminal post or a similar element.

4. The device according to claim 3, wherein the first output copper bar is rotatably mounted with the first copper pillar and the second output copper bar is rotatably mounted with second copper pillar, thus when rotating the first output copper bar and/or the second output copper bar to the first copper pillar and/or the second copper pillar will change the distance between the output coupling holes so that the first output copper bar and the second output copper bar are coupleable with pairs of positive and negative battery terminal posts having various different distances.

5. The device according to claim 1, wherein the first output connector and the second output connector are the first output copper bar and the second output copper bar, respectively.

6. The device according to claim 5, wherein each of the first output copper bar and the second output copper bar having at least one output coupling hole for coupling the output copper bar with a battery terminal post or a similar element.

7. The device according to claim 6, wherein the output coupling hole having an oval shape, so that the first output copper bar and the second output copper bar are coupleable with pairs of positive and negative battery terminal posts having various different distances.

8. The device according to claim 1, wherein the first output connector and the second output connector are measuring rods.

9. The device according to claim 1, wherein the control and processing unit is further configured to:
- controlling the inductive pulse generating unit to generating the inductive pulses according to the pulse frequency with its value gradually varies from low to high being in a range from a lower threshold pulse frequency to an upper threshold pulse frequency,
- sampling continuously the signal of the measurement inductive current to determine the value of the current and the signal form of the measurement inductive current,
- determining, based on the value of the current and the signal form of the measurement inductive current, the natural oscillation frequency of the closed circuit which is composed by the output resonant oscillating unit and the target object to be measured resistance or internal resistance,
- wherein the natural oscillation frequency is determined corresponding to the pulse frequency which generates the value of the current of the measurement inductive current having a maximum value and/or the signal form of the measurement inductive current having a substantially sinusoidal signal.

10. The device according to claim 1, wherein the device further comprising a device housing exposing at least a part of the first output connector and the second output connector.

* * * * *